United States Patent
Voss et al.

(10) Patent No.: US 11,805,715 B2
(45) Date of Patent: Oct. 31, 2023

(54) PULSE COMPRESSION PHOTOCONDUCTIVE SEMICONDUCTOR SWITCHES

(71) Applicants: Lawrence Livermore National Security, LLC, Livermore, CA (US); The Board of Trustees of the University of Illinois, Urbana, IL (US)

(72) Inventors: Lars F. Voss, Livermore, CA (US); Adam Conway, Livermore, CA (US); Karen Marie Dowling, Dublin, CA (US); David Lawrence Hall, San Ramon, CA (US); Shaloo Rakheja, Urbana Champaign, IL (US); Kexin Li, Urbana, IL (US)

(73) Assignees: LAWRENCE LIVERMORE NATIONAL SECURITY, LLC, Livermore, CA (US); THE BOARD OF TRUSTEES OF THE UNIVERSITY OF ILLINOIS, Urbana, IL (US)

( * ) Notice: Subject to any disclaimer, the term of this patent is extended or adjusted under 35 U.S.C. 154(b) by 104 days.

(21) Appl. No.: 17/502,681

(22) Filed: Oct. 15, 2021

(65) Prior Publication Data
US 2022/0123211 A1     Apr. 21, 2022

Related U.S. Application Data

(60) Provisional application No. 63/094,059, filed on Oct. 20, 2020.

(51) Int. Cl.
*H01L 47/02* (2006.01)
*H10N 80/10* (2023.01)

(52) U.S. Cl.
CPC ................... *H10N 80/103* (2023.02)

(58) Field of Classification Search
CPC ............ H10N 70/883; H10N 70/8828; H10N 70/882; H10N 70/881; H10N 70/00;
(Continued)

(56) References Cited

U.S. PATENT DOCUMENTS 3,917,943 A * 11/1975 Auston ................... H01L 31/09
257/E31.093
4,376,285 A * 3/1983 Leonberger ........... H01L 31/162
257/664
(Continued)

FOREIGN PATENT DOCUMENTS

JP     2017049389 A    3/2017
WO    2020131054 A1    6/2020

OTHER PUBLICATIONS

International Search Report and Written Opinion dated Sep. 16, 2019 for International Patent Application No. PCT/US2018/066589.

*Primary Examiner* — John R Lee
(74) *Attorney, Agent, or Firm* — Perkins Coie LLP

(57) ABSTRACT

A photoconductive switch that uses materials that support negative differential mobility, whose operation leverages the pulse compression of a charge could to generate the "on" time of the pulse in combination with the speed of light to generate the "off" time of the pulse, is described. In one example, a method of operating a photoconductive switch, which includes two electrodes and a light absorbing material positioned therebetween, includes selecting a value for one or more parameters comprising a voltage for generation of an electric field, a spot size of a laser pulse, a temporal pulse width of the laser pulse, or an intensity of the laser pulse, wherein the selected value(s) for the one or more parameters enable the switch to operate in a region where the light absorbing material exhibits negative differential mobility,
(Continued)

and illuminating the light absorbing material with the laser pulse to generate a charge cloud within the light absorbing material.

20 Claims, 8 Drawing Sheets

(58) Field of Classification Search
CPC .... H10N 80/107; H10N 80/103; H10N 80/10; H10N 80/01; H10N 80/00; H01S 5/0428
See application file for complete search history.

(56) References Cited

U.S. PATENT DOCUMENTS

| | | | | |
|---|---|---|---|---|
| 4,490,709 | A * | 12/1984 | Hammond | H01L 31/09 257/E31.093 |
| 4,695,733 | A * | 9/1987 | Pesavento | H03K 17/78 327/187 |
| 4,727,349 | A * | 2/1988 | MacDonald | H01L 31/184 257/E31.052 |
| 4,899,204 | A | 2/1990 | Rosen et al. | |
| 4,918,508 | A * | 4/1990 | McIntyre | H01L 31/09 257/E31.093 |
| 5,332,918 | A * | 7/1994 | Smith | H01L 29/517 257/E31.093 |
| 2005/0179680 | A1 | 8/2005 | Makino | |
| 2007/0092812 | A1 | 4/2007 | Caporaso et al. | |
| 2014/0263945 | A1 | 9/2014 | Huang et al. | |
| 2021/0336131 | A1* | 10/2021 | Voss | H01S 5/0428 |
| 2022/0123211 | A1* | 4/2022 | Voss | H10N 80/103 |

* cited by examiner

PULSE COMPRESSION PHOTOCONDUCTIVE SEMICONDUCTOR SWITCHES

CROSS-REFERENCE TO RELATED APPLICATION

This patent document claims priority to and benefits of U.S. Provisional Patent Application No. 63/094,059 entitled "PULSE COMPRESSION PHOTOCONDUCTIVE SEMICONDUCTOR SWITCHES," filed on Oct. 20, 2020. The entire contents of the before-mentioned patent application is incorporated by reference as part of the disclosure of this patent document.

STATEMENT REGARDING FEDERALLY SPONSORED RESEARCH OR DEVELOPMENT

This invention was made with Government support under Contract No. DE-AC52-07NA27344 awarded by the United States Department of Energy. The Government has certain rights in the invention.

TECHNICAL FIELD

This document relates to photoconductive switches capable of generating high-frequency current pulses.

BACKGROUND

Power semiconductors switching devices are integral to modern power electronics converters, and high-frequency switching is required for many applications including inverters, pulsed power, and generation of electromagnetic waves. Existing switches based on semi-insulating materials rely on deep doping levels both as a source for excited carriers and as a recombination center to turn off the switch. However, the switching frequency of these devices are limited by the recombination time of the carriers.

SUMMARY

A photoconductive switch comprising an optically actuated photoconductive material with a negative differential mobility regime situated between opposing electrodes is disclosed. Pulsed light such as a laser is incident on the photoconductive material, generating a cloud of charge carriers of specified size. The carriers drift towards one or both electrodes and generate a current on arrival. Pulse compression is achieved leveraging electric field domains and charge screening which causes the electric pulse to narrow in time, enabling high-frequency current pulses up to or exceeding 1 THz.

DETAILED DESCRIPTION

A photoconductive switch is an electrical switch which is based on the photoconductivity of a material, i.e., an increase in its electrical conductance as a consequence of irradiation with light. Photoconductive switches typically use a semiconductor material, in which the absorbed light (with a photon energy above the band gap energy) generates free carriers, which then contribute to the conductivity.

Some existing implementations of photoconductive switches for high-frequency switching applications are typically based on semi-insulating silicon carbide (SiC) rely on deep vanadium (V) levels both as a source for excited carriers and as a recombination center to turn off the switch. This latter step results in a switch limited by the ~6× the recombination time of the carriers in order to achieve nearly full off with a 50% duty cycle. In practice, this limits the technology to <2 GHz operation. In addition, the conversion efficiency of photons to current decreases as the recombination time is decreased.

The disclosed technology overcomes these drawbacks and provides additional features and benefits, which allow the use of the disclosed switches in many applications including, but not limited to, photoconductive sampling (e.g., testing of high-speed integrated electronic circuits), the generation of terahertz pulses, the generation of microwaves and millimeter waves (e.g., in continuous-wave mode and pulsed mode), as high-speed photodetectors in optical fiber communications, and in very fast analog-to-digital converters.

Figure 1:
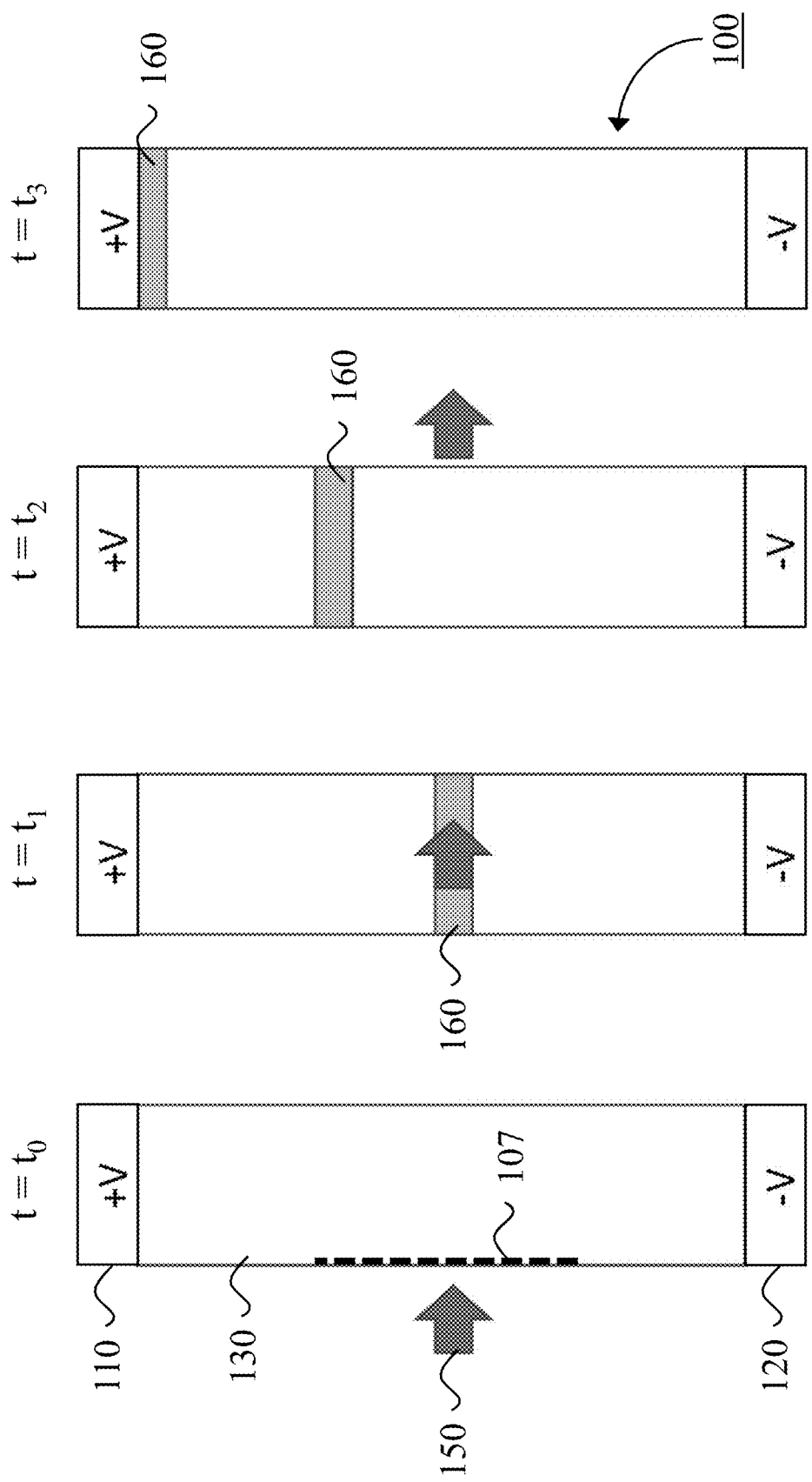
FIG. 1 is an illustration of the operation of a photoconductive switch.

Before describing the improved systems and methods of the present disclosure, it is instructive to explain the structure and principles of operations of photoconductive switches that operate based on generation and propagation of charged particle clouds. The disclosed embodiments, while entail distinct materials and principles of operations, can be applied to photoconductive switch configurations that are described below to improve their functionalities. FIG. 1 illustrates a switch 100. The switch 100 is a semiconductor (or solid-state) based switch that can controllably operate (e.g., generate a pulse) in the sub-terahertz (e.g., 10-300 GHz) and single terahertz (e.g., 300 GHz to 3 THz) ranges in accordance with the disclosed technology. The switch of FIG. 1 includes a first (e.g., positive) electrode 110 and a second (e.g., negative) electrode 120 at two ends of an absorbing region 130. In some embodiments, the absorbing region is a semiconductor (e.g., GaAs), and the electrodes are made of a metal or a metallic alloy (e.g., a graphite mixture). In some embodiments, one of the electrodes may be a ground electrode (e.g., the second electrode may be at ground level).

In operation, at t=$t_0$, an input light beam 150 (e.g., a laser pulse) is incident on the absorbing region 130 of the switch 100.

At t=$t_1$, the laser pulse has entered the absorbing region 130 and created a charge carrier cloud 160 (e.g., an electron cloud) in the region of the absorbing region that the input light beam entered. In some embodiments, the charge carrier is an electron cloud, while in other embodiments, it may be primarily comprised of holes. For example, the absorbing region may be doped SiC, and the charge carrier cloud 160 may be 2 microns ($2\times10^{-6}$ m) tall. While the charge carrier cloud 160 is illustrated as a rectangle for illustration purposes, the charge carrier cloud 160 can have different shapes, as will be described later in this document.

At t=$t_2$, and as illustrated in FIG. 1, the electron cloud 160 drifts toward the positive electrode 110 at high-speed. For example, the 2-micron tall electron cloud may travel at a saturation velocity (e.g., the maximum velocity a charge carrier in a semiconductor attains in the presence of very high electric fields) of $2.2\times10^7$ cm/sec.

At t=$t_3$, the electron cloud 160 reaches the positive electrode 110, and begins to be collected by the first electrode 110. This begins the "on" time of the pulse that is created by the switch. The "on" time ends (which also defines the "off" time of the pulse beginning), when the charge carrier cloud has been collected by the electrode. For example, the 2-micron tall electron cloud generated in SiC, and travelling at a saturation velocity of $2.2\times10^7$ cm/s, can be collected in 9 picoseconds, which corresponds to an operating frequency of around 60 GHz for a 50% duty cycle.

After creation of the charge carrier cloud 160, the light beam 150 passes out of the absorbing region (as illustrated in FIG. 1 at t=$t_2$), and can be reflected back into the same semiconductor to generate the next pulse (not shown in FIG. 1). For example, the laser beam can travel through another medium before being reflected back into the same semiconductor. The distance before re-entering the semiconductor is determined by the speed of light and governs the "off" time of the switch. In the example discussed in the context of FIG. 1, approximately 4 mm in air generates the required 50% off time.

Similarly, an operating frequency of 600 GHz may be achieved by using a charge carrier cloud with height 200 nanometers (nm), and over a 1 THz operating frequency can be achieved with 100 nm tall charge carrier cloud.

The charge carrier cloud, as illustrated in FIG. 1, has a rectangular profile, which may be implemented using, for example, a mask to block some parts of the laser beam as it enters the absorbing material, or using the characteristics of the absorbing material, or both. In some embodiments, the charge carrier cloud has a Gaussian shape as it travels towards one of the electrodes.

Figure 2:
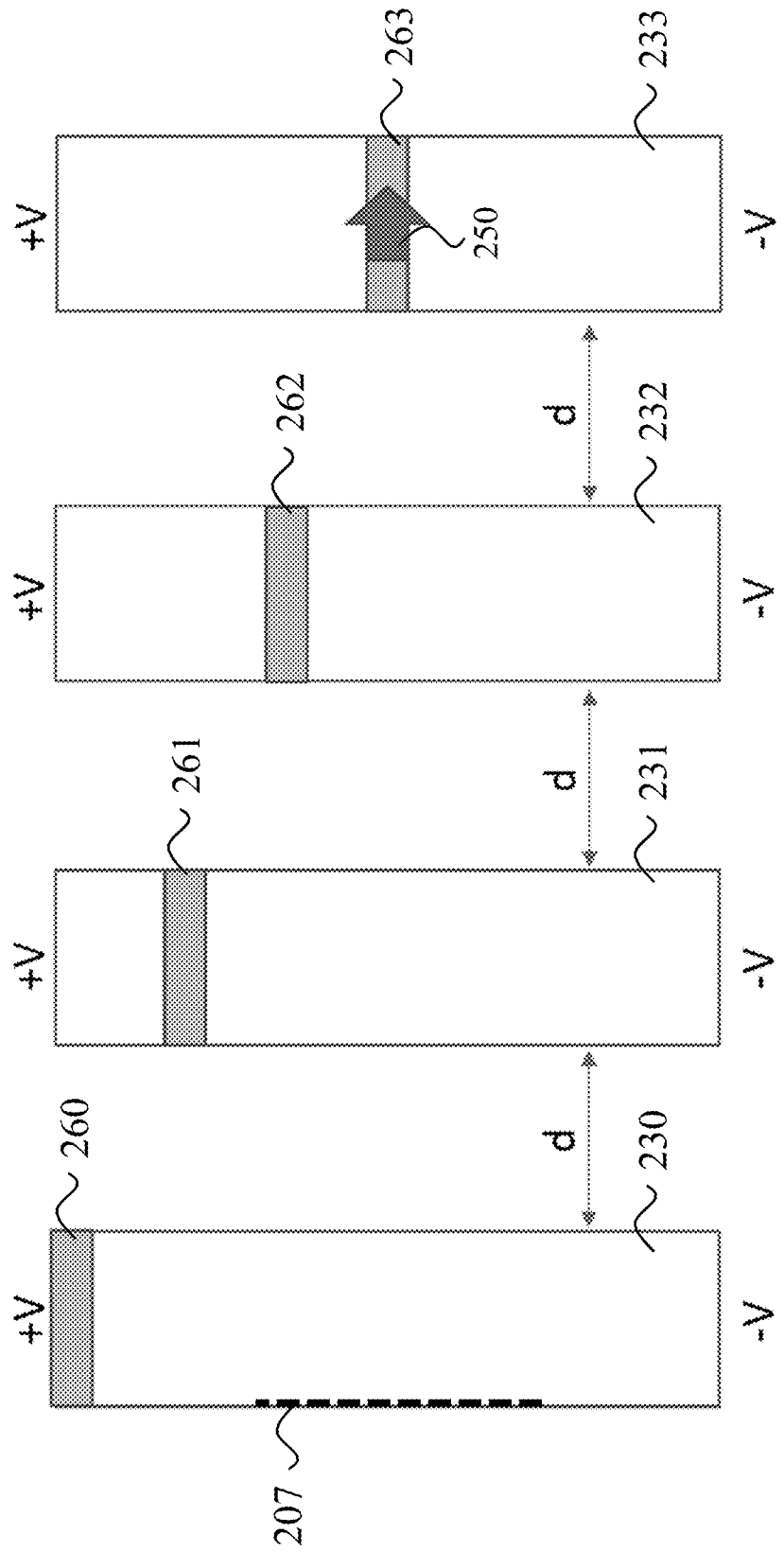
FIG. 2 is another illustration of the operation of a photoconductive switch.

FIG. 2 illustrates the operation of the configuration of another switch similar to that illustrated in FIG. 1. The switch illustrated in FIG. 1, which includes a region of absorbing material sandwiched between first and second electrodes, may be replicated to provide the generation of a pulse train, as illustrated in FIG. 2. Note that FIG. 1 illustrated the evolution of charge carrier cloud in the switch as a function of time, whereas FIG. 2 illustrates a configuration wherein the switch is replicated and spaced apart (with absorbing layers 230, 231, 232, 233, respectively).

The laser pulse 250 is illustrated creating a fourth charge carrier cloud 263 in the absorbing region 233 of the fourth switch. Its propagation through the absorbing regions of the first three switches (230, 231 and 232) results in three charge carrier clouds (260, 261 and 262), respectively, which move towards the first electrode of their respective switch. As each of the charge carrier clouds is collected by the respective first electrode, the switch will generate a substantial amount of current. The switches in series will therefore generate a continuous pulse train, which has important applications in high-frequency communication systems.

FIGS. 1 and 2 describe the general principal of photoconductive switches in which a discrete charge cloud is created within the semiconductor, which then drifts towards one or both electrodes. Upon arrival, a current pulse is created. The width in time (or duration) of the current pulse is then dictated by the size of the charge cloud and its velocity; essentially, the pulse begins as the first carriers arrive and ends as the last ones arrive. As discussed above, existing implementation rely on the recombination time of the carriers to determine the duty cycle. However, the conversion efficiency of photon-to-current conversion decreases as the recombination time is decreased, thereby limiting the operating frequency of the switch. The embodiments of the disclosed technology, among other features and benefits, overcome the above noted limitation, by using materials that support negative differential mobility, which enable further compression of the charged particle cloud under specific conditions as described herein. Accordingly, by creating a relatively small charge cloud moving at high velocity, the charge carriers can be collected in an extremely short time window, at or below 1 picosecond for certain configurations. The "off-state" time is dictated by the time between charge clouds arriving and can be created either through the geometric design of the device and a single laser pulse or by using an appropriately fast pulsed laser. The two types of configurations disclosed herein support either single pulse generation (as illustrated in FIG. 1) or multi-pulse generation (as illustrated in FIG. 2).

Embodiments of the disclosed technology use materials (e.g., the absorbing material illustrated in FIGS. 1 and 2) that support negative differential mobility (NDM). When a semiconductor device is placed under increasing electric fields, a saturation velocity is typically reached, and the velocity no longer increases at an electric field known as the saturation field ($E_{sat}$). In NDM materials, this velocity starts to decrease at fields values higher than $E_{sat}$. For instance, when the charge cloud is created in the NDM material in response to incident light from a light source, the internal electric field of the charge cloud will screen the carriers. Carriers at the front of the charge cloud (e.g., charged particles positioned at the front section of the traveling cloud) will experience a larger electric field ($E_{front}$) than those at the back of the charge cloud (which experience, on average, as smaller field, $E_{back}$). When $E_{back}$ is higher than $E_{sat}$, this means the average drift velocity is higher at the back of the charge cloud than the front, thus causing the charge cloud to compress spatially and temporally. The current pulse begins as the first carriers arrive and ends as the last ones arrive—the total time of this pulse will be even shorter than in prior implementations. Thus, the current pulses can be created at a pulse period that is shorter than the temporal width of the initial laser pulse. In an example, using NDM decreases the pulse width by a factor of greater than two, and leads to a 100× improvement in power for high frequency pulsed devices. In another example, NDM can also overcome spatial/temporal limits of the input pulse to create devices faster than the input pulse.

Figure 3:
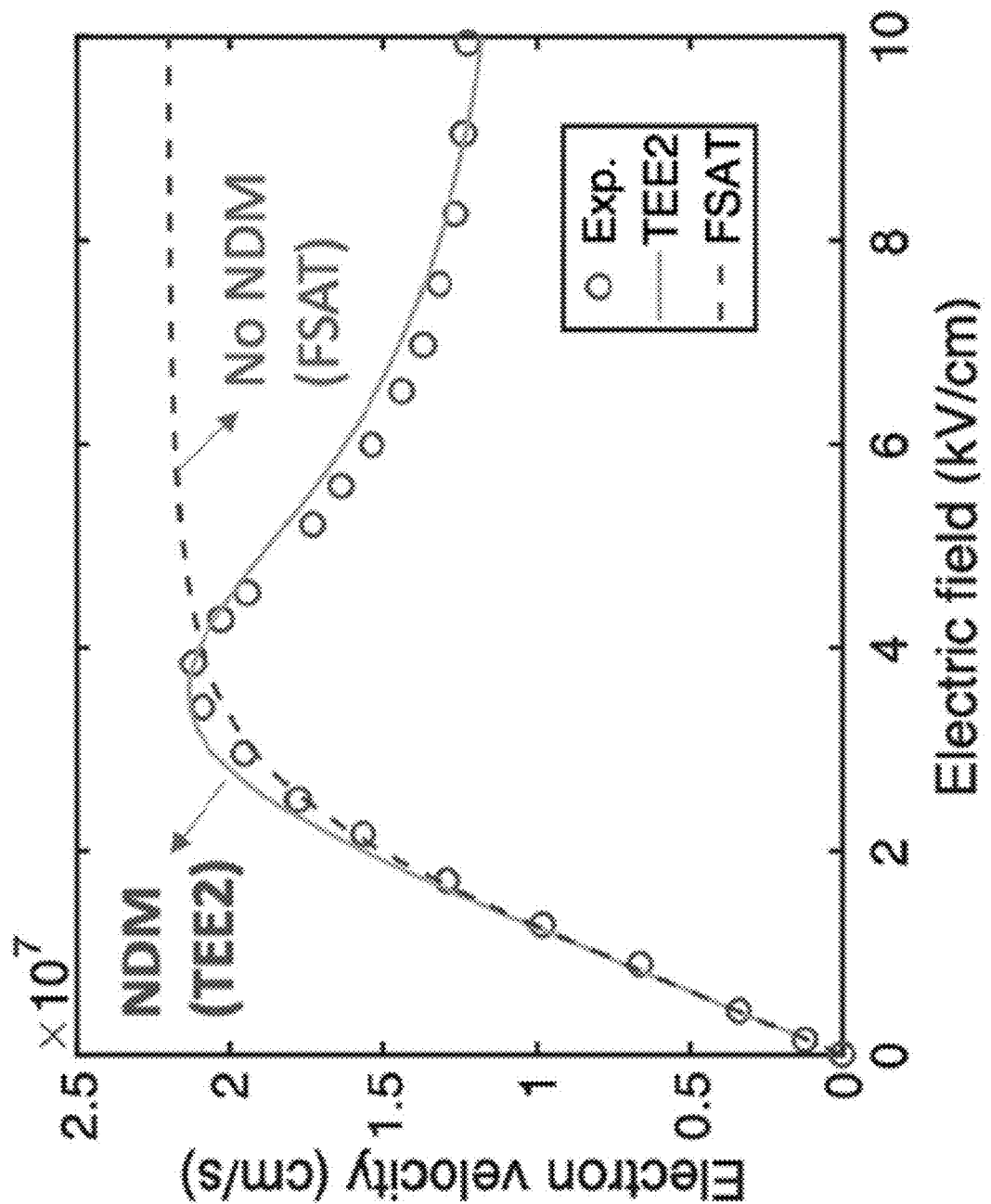
FIG. 3 plots an example of negative differential mobility in GaAs.

FIG. 3 compares the effects of NDM (both theoretical, as indicated by the solid line, and experimental, as indicated by the circular markers) to typical saturation velocity (as indicated by the dash line) without NDM for gallium arsenide (GaAs). As illustrated in FIG. 3, the electron mobility becomes negative when the electric field increases beyond a threshold value (e.g., ~3.8 kV/cm in the example in FIG. 3), which is parametrically fit by the TEE2 model. The slope of the curve between 4-6 kV/cm affects the compression of the charge cloud. By operating at the region where the electron velocity has a negative slope, additional pulse compression can be achieved; the steeper the curve, the greater the compression of the charge cloud.

Continuing with the description of FIG. 3, the electron mobility ($\mu$) for typical saturation velocity model (FSAT) is described as:

$$\mu(FSAT) = \frac{\mu_{low}}{\left(1 + \left(\frac{\mu_{low}E}{v_{sat}}\right)^\beta\right)^{1/\beta}}.$$

The electron mobility model for materials supporting NDM that account for the transfer electron effect (TEE2) is described as:

$$\mu(TEE2) = \frac{\mu_{low} + v_{sat}E(E/E_0)^\beta}{1 + (E/E_0)^\beta}.$$

In an example, illustrative parameters for the mobility models for GaAs are shown in Table 1.

TABLE 1

Example parameters for mobility models in GaAs

|  | TEE2 | FSAT |
| --- | --- | --- |
| $E_0$ (V/cm) | 4000 | N/A |
| $\mu_{low}$ (cm$^2$/(V·s)) | 8000 | 8000 |
| $v_{sat}$ (cm/s) | $10^7$ | $2.2 \times 10^7$ |
| $\beta$ | 4 | 4 |

The use of the materials supporting NDM for photoconductive switches results in high switching frequencies only when the parameters of the switch and the system are configured to leverage the NDM effect. In the described embodiments, the pulse compression effect can be achieved for specific NDM material by selecting the appropriate parameters, for example, include the strength of the applied electric field, the spot size of the laser pulse, the temporal pulse width of the laser pulse, and/or the intensity of the laser pulse.

Figure 4:
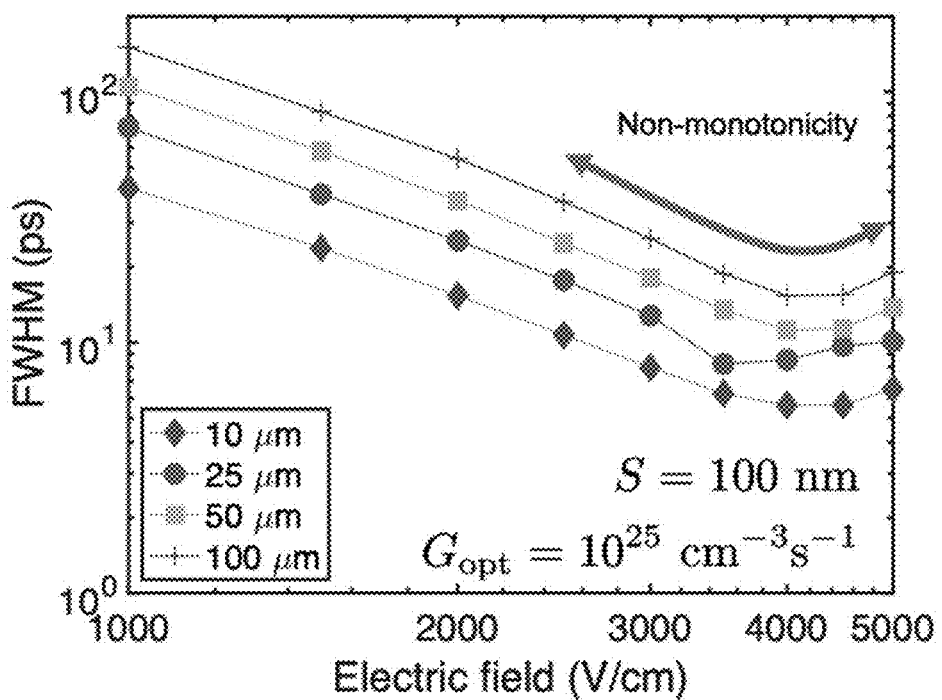
FIG. 4 plots the dependence of the full width at half maximum (FWHM) on the electric field for an example GaAs pulse compression semiconductor switch (PCSS).
Figure 5:
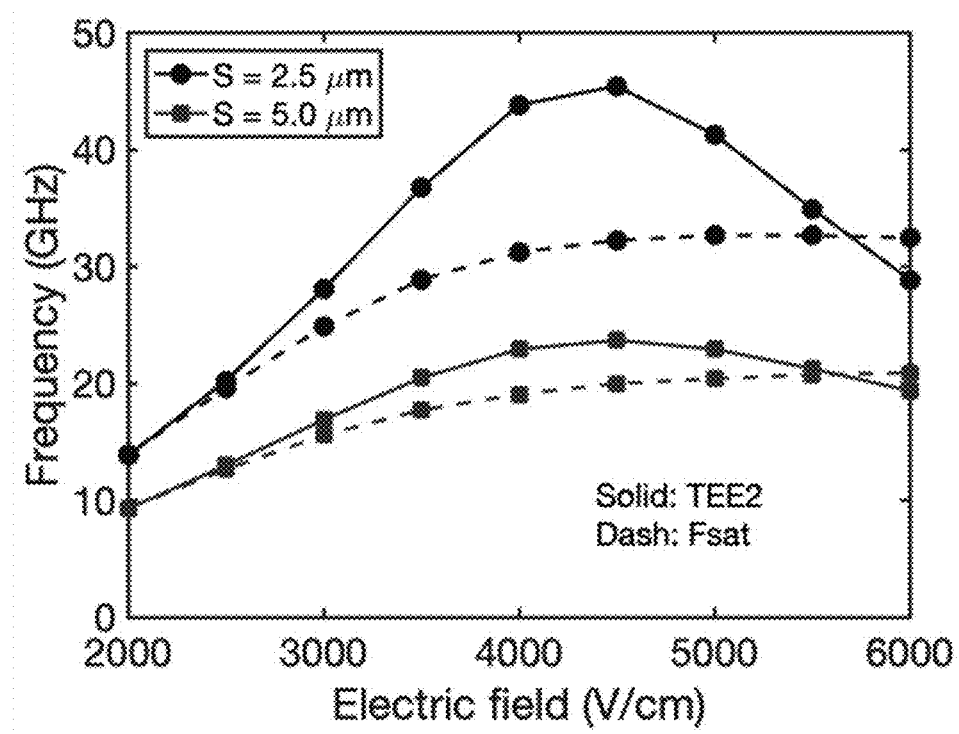
FIG. 5 plots an example of optimal pulse compression.

The numerical results illustrated in FIGS. 4 to 6B span a portion of the trade space used in the design of the described embodiments. Simulation results with a laser pulse spot size (S) of 100 nm and an optical generation rate of $10^{25}$ cm$^{-3}$/s are shown in FIG. 4, wherein the full width at half maximum (FWHM) in picoseconds is shown as a function of electric field (in V/cm) for different device lengths (ranging from 10 µm to 100 µm). FIG. 4 shows the non-monotonic behavior of the FWHM as a function of the electric field due to NDM. In this example, the minima of FWHM for various channel lengths occurs at an electric field ~4 kV/cm which is the same electric field at which the drift velocity of electrons peaks. At L=10 µm, the minimum FWHM is measured to be 5.62 ps, which gives a frequency of ~90 GHz. FIG. 5 shows the effect of different pulse spot sizes (2.5 µm and 5.0 µm) that allow a frequency of up to 45 GHz operation for a 1 ps pulse and 25 µm device length. As shown in FIG. 5, NDM provides a maximal frequency between 4000 V/cm and 5000 V/cm.

Figure 6A:
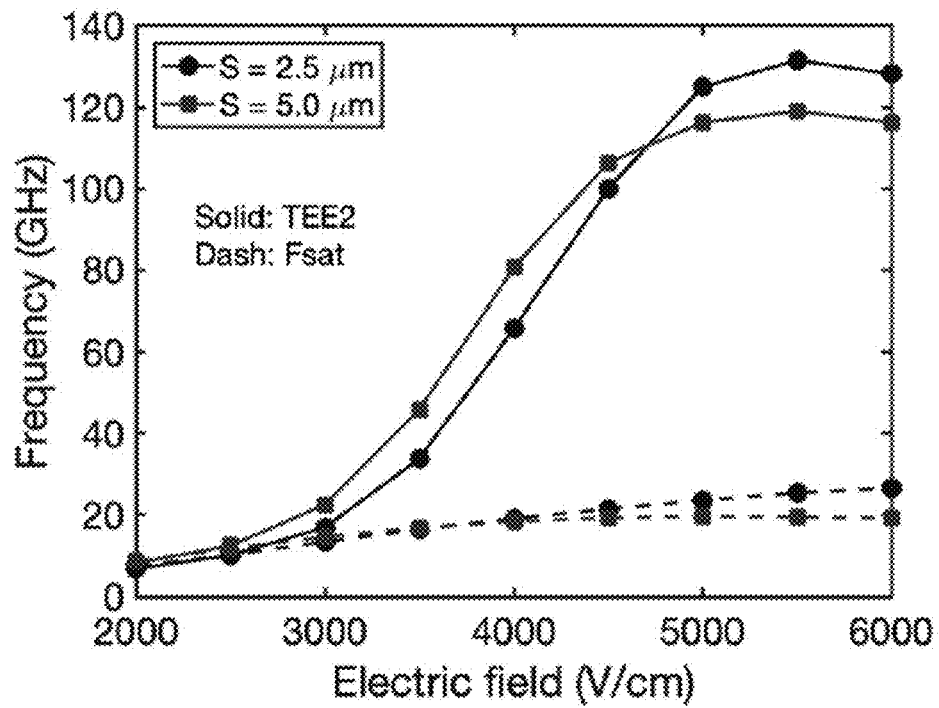
FIG. 6A plots the improvement in frequency operation for longer input pulses.
Figure 6B:
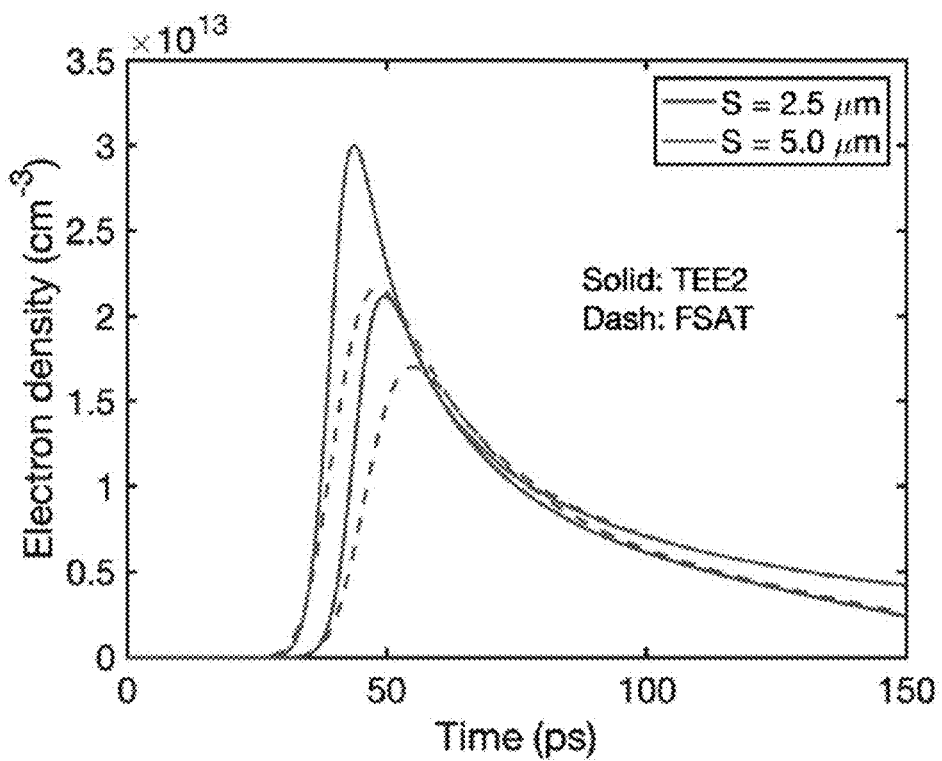
FIG. 6B plots the effect of spot size on pulse compression.

FIGS. 6A and 6B illustrate example numerical results for an optical generation rate of $10^{25}$ cm$^{-3}$/s, a 10 ps pulse width, and a device length of 25 µm. Comparing FIG. 5 and FIG. 6A illustrates that an increase in the input pulse width results in a strong increase in maximum frequency. FIG. 6B illustrates that there is a field regime wherein larger spot sizes surpass smaller spot sizes in frequency. These numerical results show that large carrier concentrations enable the pulse compression of the NDM effect. The numerical simulation results shown in FIGS. 4-6B are summarized in Table 2, where S is the laser pulse spot size, $\Delta t$ is the temporal width of the laser pulse, L is the device length, and $G_{opt}$ is the electron generate rate.

TABLE 2

Results of leveraging pulse compression in photoconductive switches

| Input parameters | | Maximum Frequency (GHz) | |
| --- | --- | --- | --- |
| ($G_{opt} = 10^{25}$ cm$^{-3}$s$^{-1}$; L = 25 µm) | | TEE2 (NDM) | FSAT (No NDM) |
| $\Delta t$ = 1 ps | S = 2.5 µm | 45 | 33 |
|  | S = 5.0 µm | 22 | 19 |
| $\Delta t$ = 10 ps | S = 2.5 µm | 132 | 27 |
|  | S = 5.0 µm | 118 | 19 |

The power of the input laser pulse can be converted to optical generate rate (i.e., the number of electrons being generated per second) based on:

$$G_{opt}(t) = \frac{P(t)}{Vhv}(1-r)(1-\exp(-\alpha t)).$$

Herein, the volume is the product of the width, thickness and laser pulse spot size. In an example, the thickness is assumed to be equal to the width (e.g., 1 µm), and the following parameter values are assumed for a wavelength of 532 nm:

Reflectivity=0
Energy=3.73E-19 Joules
Absorption coefficient=7.992×10$^4$ cm$^{-1}$ In this example, the power is 9.32 µW for a laser pulse spot size of 2.5 µm, and 18.65 µW for a laser pulse spot size of 5 µm, which results in an intensity of 373 W/cm$^2$.

The parameter selection and trade-offs discussed above can be implemented, for example, in the lateral architectures illustrated in FIGS. 7A and 7B, and the vertical architectures illustrated in FIGS. 8A and 8B, which operate based on the principles described in connection with FIGS. 1 and 2. It should be noted that the configurations that are illustrated in FIGS. 7A to 8B represent only a few example configurations, and the disclosed embodiments can be used in conjunction with other photoconductive switch configurations to enable operations at higher frequencies.

Figure 7A:
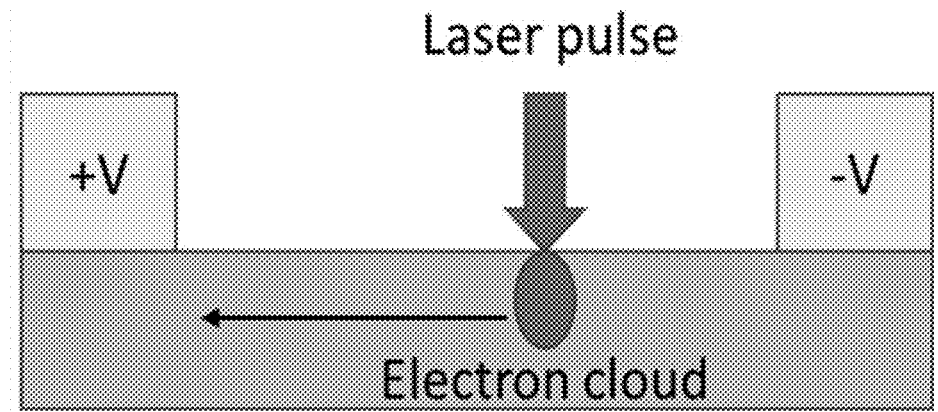
FIG. 7A illustrates an example of a lateral architecture for a PCSS.

As illustrated in FIG. 7A, a first electrode (+V) and a second electrode (−V) are separated by a layer of light absorbing semiconductor material (e.g., GaAs or GaN). A voltage is applied between the two electrodes, and a laser pulse incident on the light absorbing semiconductor layer creates an electron cloud therein that moves laterally towards the positively charged first electrode. By selecting the proper illumination and electric field parameters as described earlier, the switch can operate in a region where the semiconductor material exhibits NDM. By selectively operating the switch at region where the electron velocity verses the electric field exhibits the largest negative slope, largest pulse compression can be achieved. In another example, illustrated in FIG. 7B, an aperture can be used to limit the laser pulse being incident on the semiconductor material that exhibits NDM.

Figure 8B:
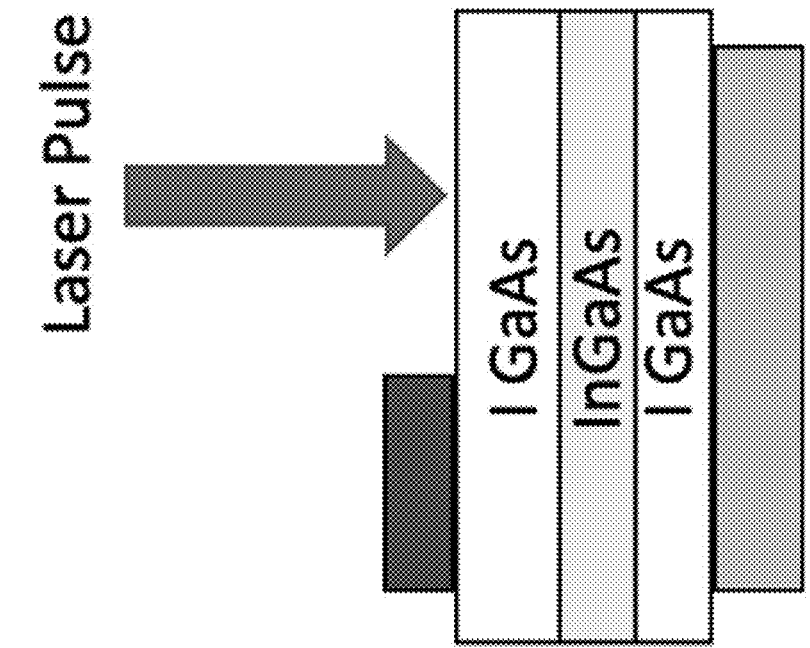
FIG. 8B illustrates another example of a vertical architecture for a PCSS.
Figure 8A:
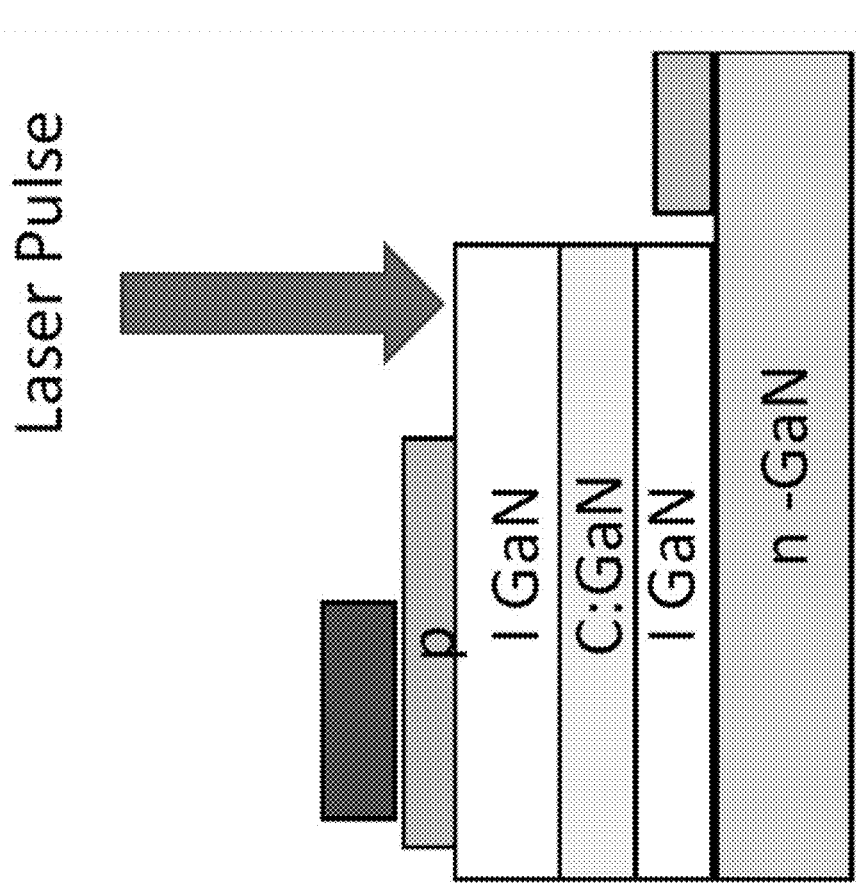
FIG. 8A illustrates an example of a vertical architecture for a PCSS.

The vertical architectures illustrated in FIGS. 8A and 8B include intrinsic NDM materials with a buried light-absorbing layer (e.g., C:GaN in FIG. 8A and InGaAs in FIG. 8B). In these examples, sub-bandgap wavelengths can be employed to limit the carrier generation to the absorbing material. In an example, shown in FIG. 8A, carbon-doped GaN can absorb carriers. In another example, shown in FIG. 8B, a heterojunction quantum well, such as GaAs—InGaAs—GaAs, can also be used. The carriers are absorbed by the thin absorbing layer, and an electric field applied as voltage in the vertical direction enables the charge cloud to propagate in the intrinsic material with NDM.

Figure 7B:
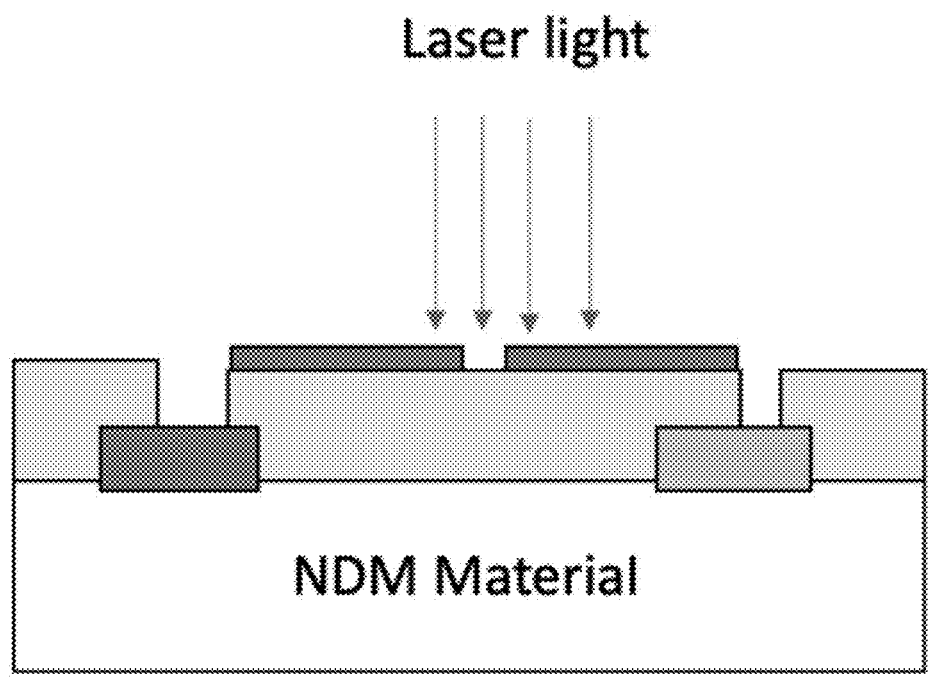
FIG. 7B illustrates another example of a lateral architecture for a PCSS.

In some embodiments, multiple apertures could be used in a lateral design (e.g., as illustrated in FIGS. 7A and 7B) to create a series of pulses. Similarly, staggered buried layers in vertical designs (e.g., as illustrated in FIGS. 8A and 8B) could be used to create a pulse train. In other embodiments, the laser pulses could be provided in quick succession, and mirrors can be added as a gain medium to bounce the original pulse back into the structure for more absorption. Additional details for these and other embodiments are described in International Application Number PCT/US2018/066589 (Publication Number WO 2020/131054) entitled "HIGH-POWER ELECTRICALLY TUNABLE SWITCH," which is incorporated in its entirety as part of this application.

Figure 9:
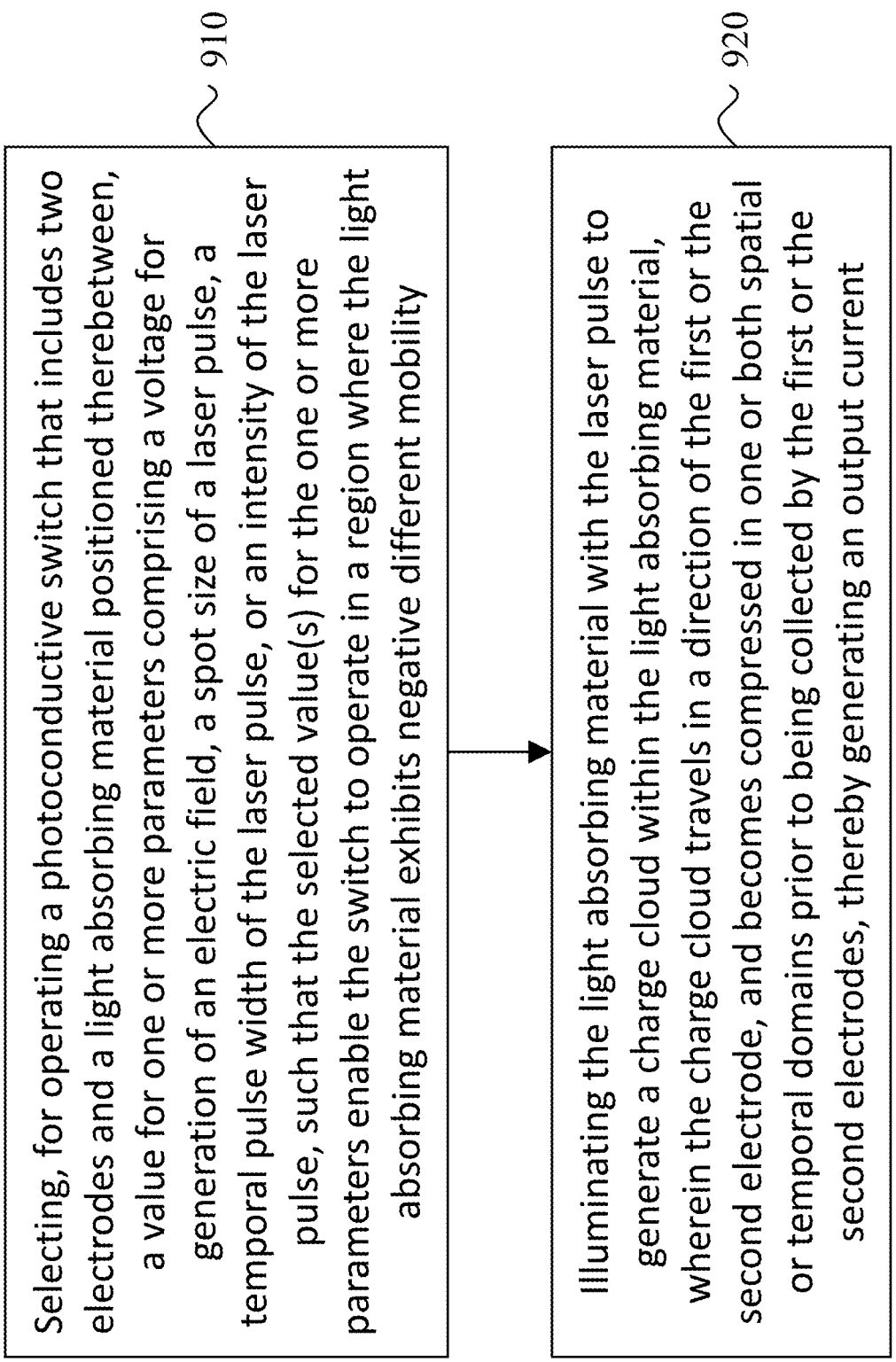
FIG. 9 is a flowchart of an example method of operating a switch.

FIG. 9 is a flowchart of an example method of operating a switch as described in the example embodiments above. The method 900 includes, at operation 910, selecting, for operating a photoconductive switch that includes two electrodes and a light absorbing material positioned therebetween, a value for one or more parameters comprising a voltage for generation of an electric field, a spot size of a laser pulse, a temporal pulse width of the laser pulse, or an intensity of the laser pulse, such that the selected value(s) for the one or more parameters enable the switch to operate in a region where the light absorbing material exhibits negative differential mobility (NDM). The one or more parameters may further include those that affect the intensity of the electric field, e.g., the size and applied voltage of the photoconductive switch and the doping of the p-i-n junction (wherein an intrinsic or undoped layer is sandwiched between a p- and an n-doped region).

The method 900 includes, at operation 920, illuminating the light absorbing material with the laser pulse to generate a charge cloud within the light absorbing material, wherein the charge cloud travels in a direction of the first or the second electrode, and becomes compressed in one or both spatial or temporal domains prior to being collected by the first or the second electrodes, thereby generating an output current.

In some embodiments, the photoconductive switch is configured to generate substantially no output current subsequent to the collection of the charge cloud by the first or the second electrodes and until another generated charge cloud reaches either the first or the second electrodes.

In some embodiments, the light absorbing material is configured as a layer.

In some embodiments, the charge cloud is compressed in both spatial and temporal domains.

In some embodiments, the value for the one or more parameters is selected based on at least one of a length of the photoconductive switch and an optical generation rate.

In some embodiments, the method 900 further includes the operation of receiving one or more additional laser pulses, and producing one or more corresponding charge clouds.

In some embodiments, a pulse period of the output current is shorter than a temporal width of the laser pulse.

In some embodiments, the light absorbing material comprises gallium arsenide (GaAs) or gallium nitride (GaN), and wherein the first electrode and the second electrode comprise a metal or a metallic alloy.

Embodiments of the disclosed technology describe a photoconductive switch that includes a first electrode, a second electrode, and a photoconductive material positioned between the first and second electrodes and configured to receive a laser pulse, wherein the photoconductive material supports operations in a region with negative differential mobility (NDM) upon selection of predetermined operating conditions based on selected parameter values that include one of more of: a voltage for generation of an electric field, a spot size of the laser pulse, a temporal pulse width of the laser pulse, or an intensity of the laser pulse.

In some embodiments, the switch comprises a lateral architecture, and the first electrode is positioned at a first end of the photoconductive switch, the second electrode is positioned at a second end of the photoconductive switch, the photoconductive material is a layer in between the first electrode and the second electrode, and an aperture is positioned on top of the photoconductive material to restrict an incidence of the laser pulse.

In some embodiments, the switch comprises a vertical architecture, and the first electrode is positioned at a top section of the photoconductive switch, a first layer of non-absorbing material is positioned below the first electrode, the photoconductive material is a layer that is positioned below the first layer of non-absorbing material, a second layer of non-absorbing material is positioned below the photoconductive material, and the second electrode is positioned below the second layer of non-absorbing material.

In some embodiments, the photoconductive switch further includes an aperture positioned on the photoconductive material to restrict an incidence of the laser pulse.

In some embodiments, the photoconductive material comprises gallium arsenide (GaAs), gallium nitride (GaN), indium phosphide (InP), cadmium telluride (CdTe), or indium antimonide (InSb), and wherein the first electrode and the second electrode comprise a metal or a metallic alloy.

In some embodiments, the spot size of the laser pulse ranges from 2 μm to 5 μm, the length of the photoconductive switch ranges from 10 μm to 25 μm, the temporal pulse width of the laser pulse ranges from 1 ps to 10 ps, and a wavelength of the laser pulse is 532 nm. In some embodiments, an optical generation rate of the photoconductive material is $10^{25}$ cm$^{-3}$/s.

In some embodiments, a velocity of the charge cloud in the photoconductive material increases as the electric field increases up to a saturation value ($E_{sat}$) and then decreases as the electric field increases beyond $E_{sat}$.

While this document contains many specifics, these should not be construed as limitations on the scope of an invention that is claimed or of what may be claimed, but rather as descriptions of features specific to particular embodiments. Certain features that are described in this document in the context of separate embodiments can also be implemented in combination in a single embodiment. Conversely, various features that are described in the context of a single embodiment can also be implemented in multiple embodiments separately or in any suitable sub-combination. Moreover, although features may be described above as acting in certain combinations and even initially claimed as such, one or more features from a claimed combination can in some cases be excised from the combination, and the claimed combination may be directed to a sub-combination or a variation of a sub-combination.

Similarly, while operations are depicted in the drawings in a particular order, this should not be understood as requiring that such operations be performed in the particular order shown or in sequential order, or that all illustrated operations be performed, to achieve desirable results. Moreover, the separation of various system components in the embodiments described in this patent document should not be understood as requiring such separation in all embodiments.

Only a few implementations and examples are described and other implementations, enhancements and variations can be made based on what is described and illustrated in this disclosure.

What is claimed is:

1. A method of operating a photoconductive switch that includes two electrodes and a light absorbing material positioned therebetween, the method comprising:
selecting or obtaining a value for the following parameters:
(a) a voltage for generation of an electric field, and
(b) one or more of: a spot size of a laser pulse, a temporal pulse width of the laser pulse, or an intensity of the laser pulse,
wherein the selected or obtained values for the parameters enable the photoconductive switch to operate in a region where the light absorbing material exhibits negative differential mobility (NDM); and
illuminating the light absorbing material with the laser pulse to generate a charge cloud within the light absorbing material, wherein the charge cloud travels in a direction of a first electrode or a second electrode of the two electrodes, and becomes compressed in a spatial domain prior to being collected by the first electrode or the second electrode, thereby generating an output current.

2. The method of claim 1, wherein the photoconductive switch is configured to generate substantially no output current subsequent to the collection of the charge cloud by the first or the second electrodes and until another generated charge cloud reaches either the first or the second electrode.

3. The method of claim 1, wherein the light absorbing material is configured as a layer.

4. The method of claim 1, wherein the charge cloud is compressed in both the spatial domain and a temporal domain.

5. The method of claim 1, wherein the values for the parameters are selected or obtained based on at least one of a length of the photoconductive switch and an optical generation rate.

6. The method of claim 1, further comprising:
receiving one or more additional laser pulses; and
producing one or more corresponding charge clouds.

7. The method of claim 6, wherein a pulse period of the output current is shorter than a temporal width of the laser pulse.

8. The method of claim 1, wherein the light absorbing material comprises gallium arsenide (GaAs), gallium nitride (GaN), indium phosphide (InP), cadmium telluride (CdTe), or indium antimonide (InSb).

9. The method of claim 8, wherein the first electrode and the second electrode comprise a metal or a metallic alloy.

10. The method of claim 1, wherein a velocity of the charge cloud in the light absorbing material increases as the electric field increases up to a saturation value ($E_{sat}$) and then decreases as the electric field increases beyond $E_{sat}$.

11. A photoconductive switch, comprising:
a first electrode;
a second electrode; and
a photoconductive material positioned between the first and second electrodes and configured to receive a laser pulse,
wherein the photoconductive material operates in a region with negative differential mobility (NDM) upon selection of predetermined operating conditions based on the following selected or obtained parameter values:
(a) a voltage for generation of an electric field,
(b) a length of the photoconductive switch, and
(c) one or more of: a spot size of the laser pulse, a temporal pulse width of the laser pulse, or an intensity of the laser pulse.

12. The photoconductive switch of claim 11, wherein the photoconductive switch comprises a lateral architecture, and wherein:
the first electrode is positioned at a first end of the photoconductive switch,
the second electrode is positioned at a second end of the photoconductive switch,
the photoconductive material is a layer in between the first electrode and the second electrode, and
an aperture is positioned on top of the photoconductive material to restrict an incidence of the laser pulse.

13. The photoconductive switch of claim 11, wherein the photoconductive switch comprises a vertical architecture, and wherein:
the first electrode is positioned at a top section of the photoconductive switch,
a first layer of non-absorbing material is positioned below the first electrode,
the photoconductive material is a layer that is positioned below the first layer of non-absorbing material,
a second layer of non-absorbing material is positioned below the photoconductive material, and
the second electrode is positioned below the second layer of non-absorbing material.

14. The photoconductive switch of claim 13, wherein the selected or obtained parameter values further include a doping level of the first layer of non-absorbing material, the photoconductive material, or the second layer of non-absorbing material.

15. The photoconductive switch of claim 11, further comprising:
an aperture positioned on the photoconductive material to restrict an incidence of the laser pulse.

16. The photoconductive switch of claim 11, wherein the photoconductive material comprises gallium arsenide (GaAs), gallium nitride (GaN), indium phosphide (InP), cadmium telluride (CdTe), or indium antimonide (InSb).

17. The photoconductive switch of claim 11, wherein the first electrode and the second electrode comprise a metal or a metallic alloy.

18. The photoconductive switch of claim 11, wherein the spot size of the laser pulse ranges from 2 μm to 5 μm, wherein the length of the photoconductive switch ranges from 10 μm to 25 μm, wherein the temporal pulse width of the laser pulse ranges from 1 ps to 10 ps, and wherein a wavelength of the laser pulse is 532 nm.

19. The photoconductive switch of claim 18, wherein an optical generation rate of the photoconductive material is $10^{25}$ cm$^{-3}$/s.

20. The photoconductive switch of claim 11, wherein a velocity of a charge cloud in the photoconductive material increases as the electric field increases up to a saturation value ($E_{sat}$) and then decreases as the electric field increases beyond $E_{sat}$.

\* \* \* \* \*